United States Patent [19]

Muraki

[11] Patent Number: 5,120,974
[45] Date of Patent: Jun. 9, 1992

[54] POSITION DETECTING METHOD AND DEVICE USING IMAGE PICKUP OF A MARK

[75] Inventor: Masato Muraki, Yokohama, Japan

[73] Assignee: Canon Kabushiki Kaisha, Tokyo, Japan

[21] Appl. No.: 728,313

[22] Filed: Jul. 8, 1991

Related U.S. Application Data

[63] Continuation of Ser. No. 622,348, Nov. 29, 1990, abandoned, which is a continuation of Ser. No. 475,936, Feb. 6, 1990, abandoned.

[30] Foreign Application Priority Data

Feb. 7, 1989 [JP] Japan ................. 1-028144

[51] Int. Cl.⁵ .................... G01N 21/86; G01V 9/04
[52] U.S. Cl. ..................... 250/548; 356/401
[58] Field of Search ............ 250/548, 557, 561; 356/399, 400, 401, 152; 364/559

[56] References Cited

U.S. PATENT DOCUMENTS

| | | | |
|---|---|---|---|
| 4,251,160 | 2/1981 | Bouwhuis et al. | 356/401 |
| 4,355,892 | 10/1982 | Mayer et al. | 355/77 |
| 4,573,791 | 3/1986 | Phillips | 356/401 |
| 4,668,089 | 5/1987 | Oshida et al. | 250/548 |
| 4,669,866 | 6/1987 | Phillips | 356/401 |
| 4,777,374 | 10/1988 | Nakata et al. | 250/548 |
| 4,779,001 | 10/1988 | Makosch | 250/548 |
| 4,801,208 | 1/1989 | Katoh et al. | 250/548 |
| 4,814,829 | 3/1989 | Kosugi et al. | 355/43 |
| 4,941,745 | 7/1990 | Sugiyama | 250/548 |

Primary Examiner—David C. Nelms
Assistant Examiner—S. Allen
Attorney, Agent, or Firm—Fitzpatrick, Cella, Harper & Scinto

[57] ABSTRACT

A position detecting method and device for detecting the position of an object to be examined, through image pickup of a mark formed on the object, is disclosed. The method includes an image forming step for illuminating the mark with a radiation beam in a first direction and a second direction different from the first direction, and for forming a first image of the mark with the illumination in the first direction and forming a second image of the mark with the illumination in the second direction; a determining step for selecting one of the first and second images; and a detecting step for detecting the position of the object on the basis of the selected image or an image of the mark formed with the illumination in the direction corresponding to the selected image. The device is adapted to execute the position detection in this manner.

6 Claims, 7 Drawing Sheets

POSITION DETECTING METHOD AND DEVICE USING IMAGE PICKUP OF A MARK

This application is a continuation of prior application Ser. No. 07/622,348 filed Nov. 29, 1990, which application was a continuation of prior application Ser. No. 07/475,936 filed Feb. 6, 1990, both now abandoned.

FIELD OF THE INVENTION AND RELATED ART

This invention relates to a position detecting method and device and, more particularly, to a position detecting method and device for detecting the position of an object to be examined, such as a semiconductor wafer, for example, through image pickup of a mark formed on the object.

Usually, in this type of position detecting method and device, a mark such as an alignment mark formed on an object to be examined is illuminated perpendicularly with a radiation beam, and an image of the illuminated mark is taken through a TV camera or otherwise, such that the position of the mark can be detected by processing a video signal outputted from the TV camera. For an object such as a semiconductor wafer, however, the object is coated with a resist which is transparent with respect to the radiation beam. Also, usually, an alignment mark provided on such object comprises a relief-like pattern. Therefore, due to the interference between a beam reflected from an upper surface of the resist and a beam reflected from the surface of the object on which the mark is formed or due to the low contrast of the mark itself, it is not easy to obtain a correct image of such a mark through a TV camera or otherwise. This leads to a difficulty in detecting the position of the object accurately.

SUMMARY OF THE INVENTION

It is an object of the present invention to provide a position detecting method and device by which the position of an object to be examined can be detected accurately.

In accordance with an aspect of the present invention, to achieve this object, there is provided a position detecting method for detecting the position of an object to be examined, through image pickup of a mark formed on the object, said method comprising: an image forming step for illuminating the mark with a radiation beam in a first direction and a second direction different from the first direction, and for forming a first image of the mark with the illumination in the first direction and forming a second image of the mark with the illumination in the second direction; a determining step for selecting one of the first and second images; and a detecting step for detecting the position of the object on the basis of the selected image or an image of the mark formed with the illumination in the direction corresponding to the selected image.

In accordance with another aspect of the present invention, there is provided a position detecting method for detecting the position of a wafer coated with a resist, through image pickup of an alignment mark formed on the wafer, said method comprising: a first image forming step for illuminating the wafer with a radiation beam in a first direction and for forming a first image of the alignment mark with the beam reflected from the wafer; a second image forming step for illuminating the wafer in a second direction different from the first direction and for forming a second image of the alignment mark with the reflected beam from the wafer; a determining step for selecting an undesirable one of the first and second image to determine one of the first and second directions to be rejected; and a detecting step for detecting the position of the wafer on the basis of an image of the alignment mark formed through the illumination which is in the direction not rejected.

Also, in accordance with a further aspect of the present invention, there is provided a position detecting device for detecting the position of an object to be examined, through image pickup of a mark formed on the object, said device comprising: image pickup means for illuminating the mark with a radiation beam in a first direction and a second direction different from the first direction, and for forming a first image of the mark with the illumination in the first direction and a second image of the mark with the illumination in the second direction, said image pickup means being operable to convert the first and second images into first and second signals; and processing means for receiving the first and second signals from said image pickup means and for selecting an undesirable one of the first and second signals to determine one of the first and second directions to be rejected, such that the position of the object can be detected on the basis of an image of the alignment mark formed with the illumination in the direction not rejected.

Briefly, in the position detecting method and device according to a particular aspect of the present invention, a mark formed on an object to be examined is illuminated in different directions and images of the mark are formed through the illumination in the different directions. On the basis of contrast or intensity, for example, an undesirable one or ones of the images are discriminated from the others, and the position of the object is detected on the basis of an image or images of the mark formed through the illumination in the direction o directions other than the direction or directions corresponding to the undesirable image or images.

Thus, in accordance with this aspect of the present invention, it is possible to obtain an image of a mark on an object to be examined, by means of illumination which is effective to form an image relatively correctly and, therefore, it is possible to obtain an image of the mark suited for the correct detection of the position of the object.

In accordance with a further aspect of the present invention, there is provided a position detecting method for detecting the position of an object to be examined, on the basis of an interference fringe produced by interference between diffraction beams from a grating mark formed on the object, said method comprising: a first illumination step for illuminating the grating mark with a first coherent beam in a predetermined direction to produce a first diffraction beam in a first direction and a second diffraction beam in a second direction, wherein the first and second diffraction beams interfere with each other to produce a first interference fringe; a second illumination step for illuminating the grating mark with a second coherent beam which is mutually incoherent with the first coherent beam and in a direction different from the predetermined direction, to produce a third diffraction beam in the first direction and a fourth diffraction beam in the second direction, wherein the third and fourth diffraction beams interfere with each other to produce a second interference fringe; and a detecting step for detecting the position of the object on the basis of the first and second interference fringes.

In accordance with still a further aspect of the present invention, there is provided a position detecting method for detecting the position of a wafer coated with a resist on the basis of an interference fringe produced by interference between diffraction beams from a grating mark formed on the wafer, said method comprising: a first illumination step for illuminating the grating mark with a first coherent beam in a predetermined direction to produce a first diffraction beam in a first direction and a second diffraction beam in a second direction different from the first direction; a first forming step for causing the first and second diffraction beams to interfere with each other to form a first interference fringe; a second illumination step for illuminating, after the first illumination step and the first forming step, the grating mark with a second coherent beam in a direction different from the predetermined direction to produce a third diffraction beam in the first direction and a fourth diffraction beam in the second direction; a second forming step for causing the third and fourth diffraction beams to interfere with each other to form a second interference fringe; and a detecting step for detecting the position of the wafer on the basis of the first and second interference fringes.

In accordance with yet a further aspect of the present invention, there is provided a position detecting device for detecting the position of an object to be examined, on the basis of an interference fringe produced by interference between diffraction beams from a grating mark formed on the object, said device comprising: an illumination system for illuminating the grating mark with a first coherent beam and a second coherent beam which is mutually incoherent with the first coherent beam, in different directions, wherein a first diffraction beam is produced in a first direction and a second diffraction beam is produced in a second direction different from the first direction, through the illumination of the grating mark with the first coherent beam and wherein a third diffraction beam is produced in the first direction and a fourth diffraction beam is produced in the second direction, through the illumination of the grating mark with the second coherent beam; photoelectric converting means having a light receiving surface; a directing system for directing the first, second, third and fourth diffraction beams to said light receiving surface of said photoelectric converting means, said directing system being effective to cause the first and second diffraction beams to interfere with each other to produce a first interference fringe on said light receiving surface, and said directing system further being effective to cause the third and fourth diffraction beams to interfere with each other to produce a second interference fringe on said light receiving surface; and detecting means for detecting the position of the object on the basis of a signal obtainable from said photoelectric converting means and corresponding to the first and second interference fringes.

In the position detecting method and device according to a particular aspect of the present invention, the position of an object to be examined is detected on the basis of an interference fringe produced by the interference between diffraction beams from a grating mark formed on the object, wherein the grating mark is illuminated with a first coherent beam and a second coherent beam which is mutually incoherent with the first coherent beam, in different directions, such that first and second interference fringes are produced by the beams from the grating mark. These interference fringes can be used for the position detection. Accordingly, if the interference fringe produced by the illumination in one direction has insufficient contrast, another interference fringe produced by the illumination in another direction and having better contrast can be used for the position detection. As a result, accurate and stable position detection is assured.

In order to provide mutually incoherent first and second coherent beams, the first and second coherent beams may be directed to the grating mark in sequence or, alternatively, an optical path difference may be imparted to the first and second coherent beams.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Referring to FIGS. 1 through 4D, description will first be made to a problem underlying the present invention and revealed by the inventor of the subject application.

Figure 1:
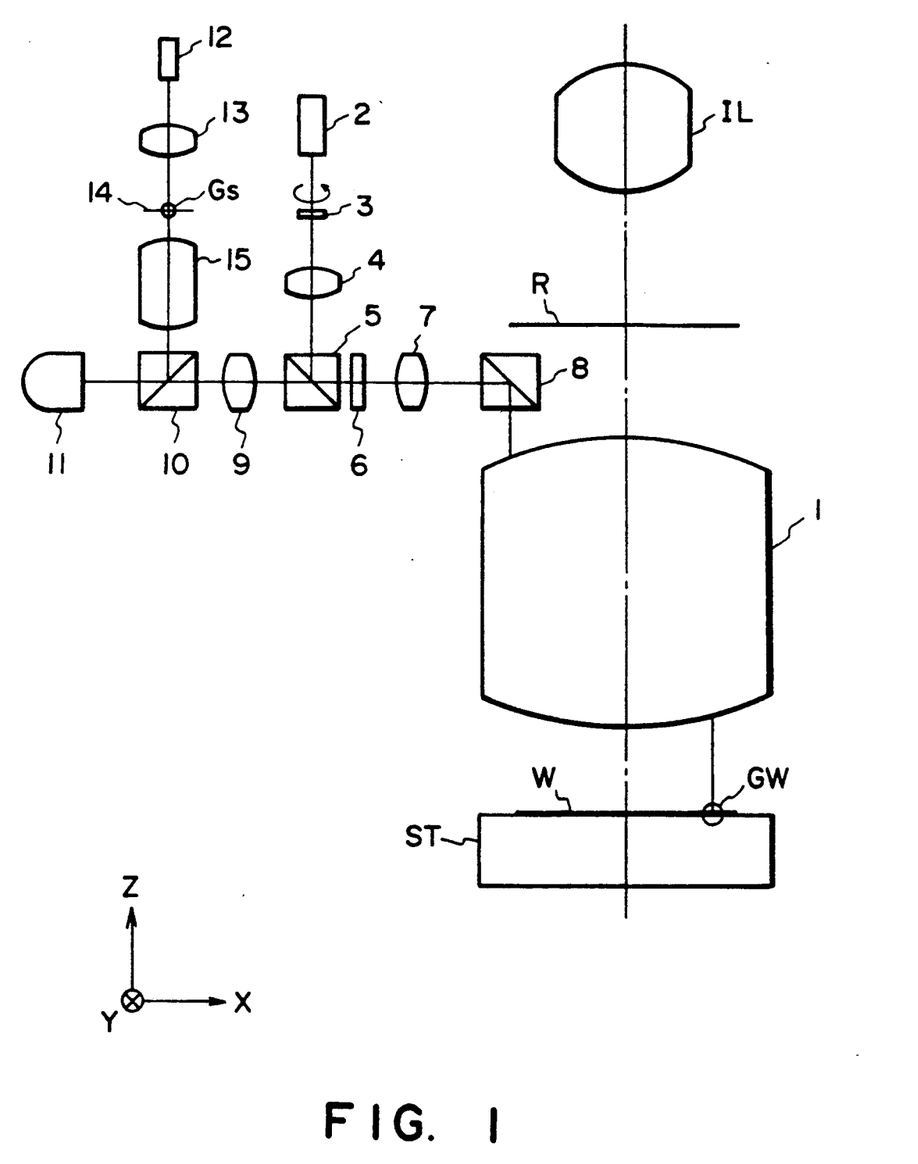
FIG. 1 is a schematic view for explaining a problem underlying the present invention, for facilitating the understanding of the present invention.

FIG. 1 shows a case wherein a position detecting device is incorporated into a semiconductor device manufacturing projection exposure apparatus. In FIG. 1, the exposure apparatus includes an illumination device IL which emits exposure light of g-line, a reduction projection lens system 1 which is aberration-corrected with respect to the g-line light and which is telecentric on the wafer side, and a wafer stage ST which is movable in a plane perpendicular to an optical axis of the projection lens system 1 and movable along the optical axis of the projection lens system. Denoted at R is a reticle on which an electronic circuit pattern is formed. The reticle is placed on a reticle stage (not shown) of the exposure apparatus. Denoted at W is a wafer having a number of shot areas in each of which a circuit pattern is formed in the preceding process or processes. The wafer is coated with a resist and is placed on the wafer stage ST. Also, in each set area of the wafer W, a wafer alignment mark GW is formed.

The exposure light from the illumination device IL illuminates the reticle R with uniform illuminance, and the electronic circuit pattern on the reticle R surface is projected in a reduced scale upon the wafer W surface, placed on the wafer stage ST, through the projection lens system 1. By this, the circuit pattern of the reticle R is transferred to a particular shot area of the wafer W.

Prior to such pattern projection and transfer, the position of the shot area of the wafer, namely, the position of the pattern formed thereon is adjusted so that it is accurately aligned with the circuit pattern of the reticle R. For this alignment, the position of the shot area of the wafer should be detected. This position detection can be made by using those elements denoted at 1-15 in FIG. 1. Denoted at 2 is a He-Ne laser which produces a laser beam of a wavelength of about 633 nm which is longer than that of the g-line. The laser beam from the laser 2 comprises a linearly polarized light, and the laser 2 is set so that it provides a laser beam of S-polarized light with respect to a beam splitting surface of a polarization beam splitter, to be described later. Also, the produced laser beam is one with respect to which the resist material on the wafer W is not substantially sensitized.

Denoted at 3 is a diffusing plate which is rotatable about an optical axis of the system by means of a driver, not shown. Denoted at 4 is a condensing lens; at 5 is a polarization beam splitter; at 6 is a quarter waveplate; at 7 is a lens; at 8 is a mirror provided between the projection lens system and the reticle stage, not shown; at 9 is a lens; at 10 is a dichroic mirror; at 11 is a solid image pickup device; at 12 is a light emitting diode (LED) which produces light of a wavelength different from that of the laser beam from the laser 2; at 13 is a condensing lens; at 14 is a reference plate on which a reference mark GS is formed; and at 15 is a lens. The quarter waveplate 6 serves to convert, into a circularly polarized light, the laser beam from the laser 2 as reflected by the polarization beam splitter 5. Also, when the thus produced circularly polarized beam is reflected by the wafer W and passes again the quarter waveplate 6, the quarter waveplate serves to convert the received circularly polarized light into a P-polarized light. The laser beam emitted by the He-Ne laser 2 and having a wavelength different from that of the exposure light, is incident on the rotating diffusing plate 5, and it is concentrated by the lens 4 and reflected by the polarization beam splitter 5. By way of the quarter waveplate 6, the lens 7, the mirror 8 and the projection lens system 1, the beam is projected to illuminate the wafer mark GW on the wafer W surface.

Figure 2A:
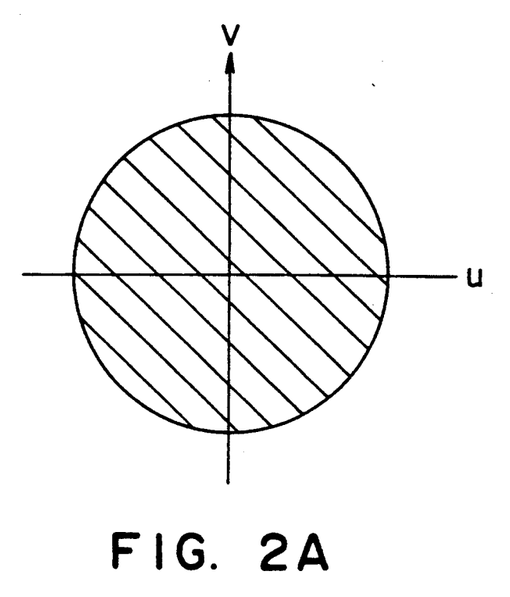
FIG. 2A shows a distribution of a laser beam on a pupil plane of a projection lens system.
Figure 2B:
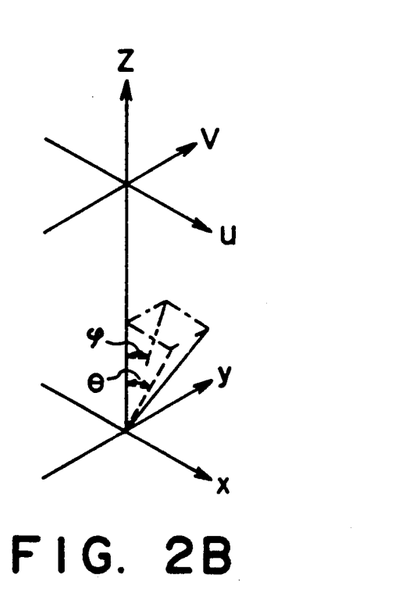
FIG. 2B illustrates the angle of incidence of a laser beam, illuminating a wafer through a projection lens system.
Figure 2C:
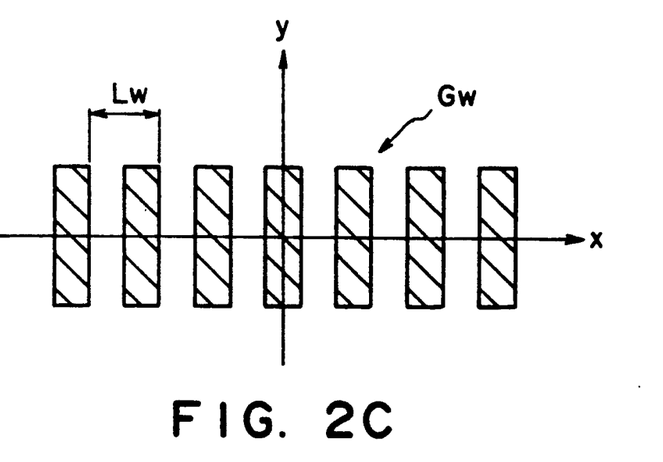
FIG. 2C illustrates an alignment mark formed on a wafer.

Here, the laser beam produces an intensity distribution (hereinafter "effective light source" such as illustrated in FIG. 2A, upon a pupil plane of an optical system including the projection lens system 1 and the lenses 4 and 7. In FIG. 2A, characters v and u denote the coordinates of the pupil plane, and this coordinate corresponds to distribution of the angle of incidence of the laser beam upon the wafer W surface. As illustrated in FIG. 2B, when the angle of incidence of the laser beam upon the wafer W surface is defined by $(\theta, \phi)$, then $\theta = \sin^{-1} u$ and $\phi = \sin^{-1} v$. As shown in FIG. 2C, the wafer alignment mark GW comprises a grating-like pattern having a pitch Lw. Hatched areas, as illustrated, correspond to protruded portions, while the surrounding blank area correspond to recessed portions on the wafer W surface. Also, as described hereinbefore, the wafer W surface is usually coated with a resist, so that the wafer mark GW is also covered by the resist.

As the wafer alignment mark GW on the wafer W surface is illuminated with the laser beam, reflected light goes through the projection lens system 1 and, by way of the mirror 8, the lens 7, the quarter waveplate 6, the polarization beam splitter 5, the lens 9 and the beam splitter 10, in the named order, it is directed to the solid image pickup device (CCD) 11, whereby an image of the wafer alignment mark GW is formed on the image pickup surface of the device 11.

On the other hand, the light from the LED 12 which emits a wavelength different from that of the laser beam, illuminating the wafer alignment mark GW, is concentrated by the lens 13 to illuminate the reference mark Gs formed on the reference plate (mask) 14 surface. The light from the reference mark Gs is directed by the lens 15 and the beam splitter 10 which is arranged to reflect the light from the LED 12 and to transmit the light from the He-Ne laser 2, whereby the light from the reference mark is projected to the image pickup device 11, such that an image of the reference mark Gs is formed on the image pickup surface thereof.

Figure 3:
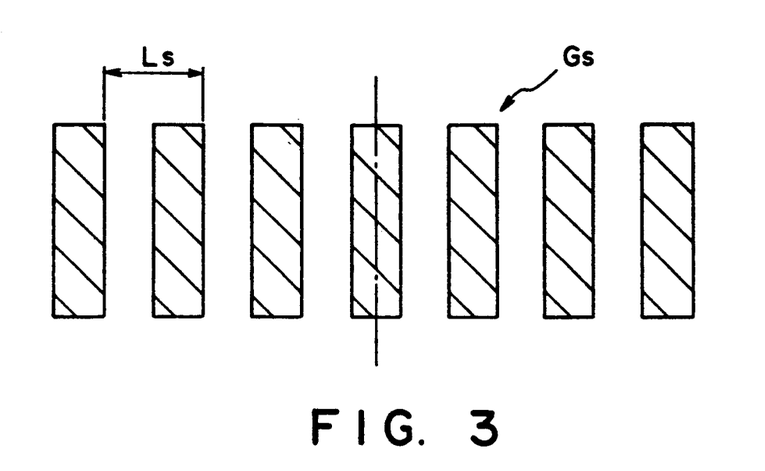
FIG. 3 illustrates a reference mark formed on a reference plate.

As shown in FIG. 3, the reference mark Gs comprises a grating-like pattern having a pitch Ls, like the wafer alignment mark GW. Hatched areas depict transparent regions while the surrounding portion depicts a non-transparent region.

Figure 4A:
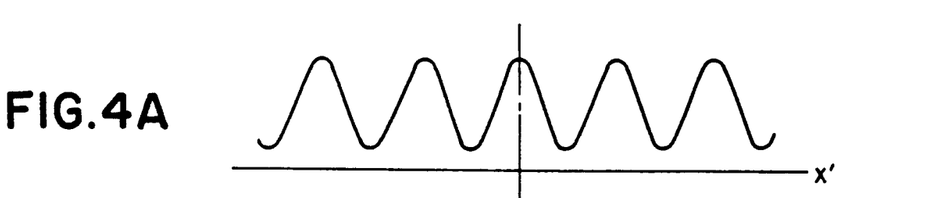
FIGS. 4A through 4D are schematic view for explaining problems involved in the detection of the position of a wafer with respect to a difference plate.
Figure 4B:
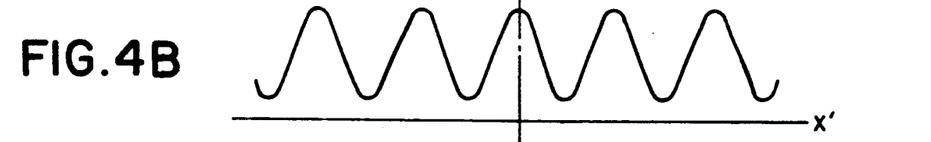
Figure 4C:
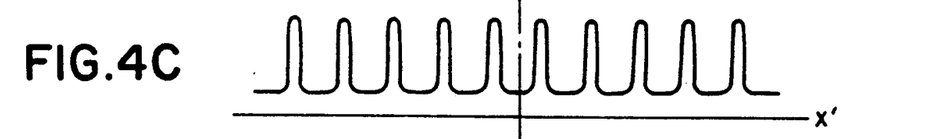

Regarding the image of the reference mark Gs and the image of the wafer alignment mark GW formed on the image pickup surface of the image pickup device 11, as illustrated in FIGS. 4A and 4B, by determining the pitches Ls and Lw of the reference mark Gs and the wafer alignment mark GW beforehand, the images of these marks on the image pickup surface of the image pickup device 11 are so formed as to be provided by grating patterns of the same pitch (Li). In FIGS. 4A through 4C, the intensity distribution of each of the mark images is depicted in a graph. From a phase difference $\Delta\delta$ between the images of the reference mark Gs and the wafer alignment mark GW, having a basic period Li, any positional deviation $\Delta X$ between the reference mark Gs and the wafer alignment mark GW can be determined, in accordance with the following equation:

$$\Delta X = L w (\Delta \delta / 2\pi)$$

Accordingly, the position of the wafer alignment mark GW with respect to the reference mark Gs, which is a reference of a stationary part of the exposure apparatus, can be detected and, therefore, the position of the wafer or the position of a particular shot area of the wafer can be determined. For detection of the positional deviation $\Delta X$, video signals from the image pickup device 11, corresponding to the images of the marks GW and Gs formed on the image pickup surface thereof, are detected and any phase difference between these video signals is detected.

As described, the relative position of the wafer alignment mark GW on the wafer W surface and the reference mark Gs on the reference plate 14 surface is detected and, on the basis of the result of the detection and the relationship of the relative position of the reference mark Gs and the reticle R having been detected in advance, the reticle R and the wafer W can be aligned with each other.

Figure 4D:
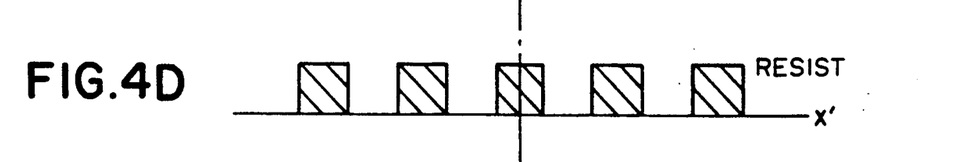

In such a position detection wherein the phase of an image of a wafer alignment mark is detected, it is preferable that the image of the reference mark and the image of the wafer alignment mark always have the same pitch. However, since the image of the wafer alignment mark is an image which is formed by the reflected light from the relief-like phase grating, if the wafer alignment mark has a sectional configuration such as shown in FIG. 4D and is covered by a resist, there is a possibility that an image of the wafer alignment mark is detected as one illustrated in FIG. 4C, by the image pickup device 11. Also, there is a possibility that a reversed image of the one as depicted in FIG. 4C is formed. Accordingly, in such cases, the image of the reference mark and the image of the wafer alignment mark have different pitches and, therefore, with the method wherein mutual phase difference is to be detected, it is not possible to detect the position accurately.

The inconveniences such as described hereinbefore can be avoided by the position detecting method and device according to the present invention.

Figure 5:
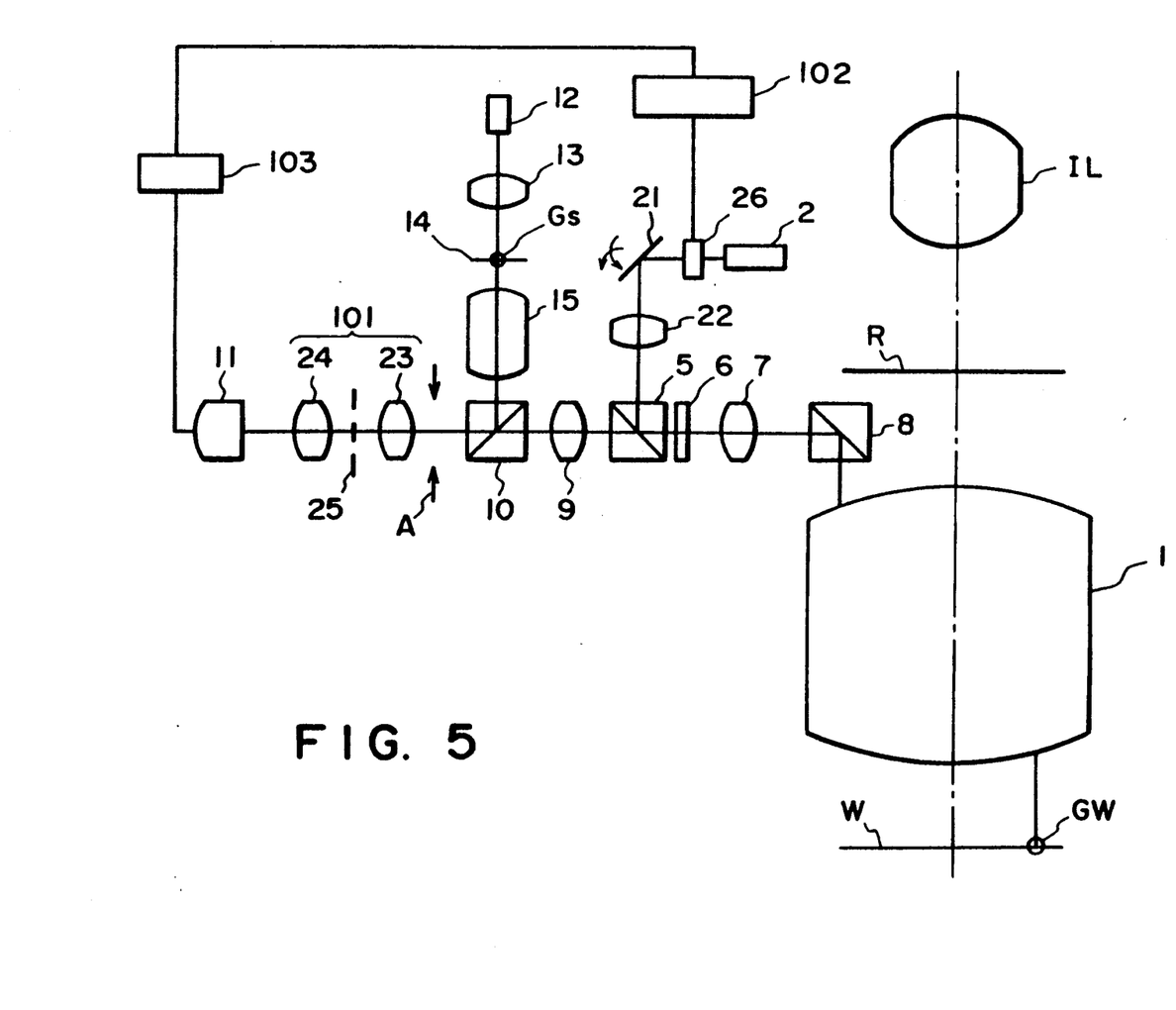
FIG. 5 is a schematic view of a position detecting device according to an embodiment of the present invention, which is incorporated into a semiconductor device manufacturing exposure apparatus.

FIG. 5 is a schematic view of a position detecting device according to an embodiment of the present invention. In FIG. 5, like numerals are assigned to the elements corresponding to those shown in FIG. 1, and description thereof will be omitted here for simplicity. As compared with the wafer alignment mark shown in FIGS. 1 and 2C, the wafer alignment mark GW illustrated in FIG. 5 is formed to have a pitch P (=2 Lw). On the other hand, the reference mark Gs formed on the reference plate 14 is the same as that shown in FIGS. 1 and 3.

Next, description will be made mainly to the elements added in FIG. 5. In place of the diffusing plate 3 and the lens 4, in this embodiment an acousto-optic element 26, a galvano mirror 21 having two orthogonal rotational axes and an F-$\theta$ lens 22 are provided between a He-Ne laser 2 and a polarization beam splitter 5. Also, there is provided a driving means 102 for actuating the element 26 to modulate the laser beam from the laser 2. On the other hand, between a dichroic beam splitter 10 and an image pickup device 11, there is provided an optical system 101 for optical Fourier transformation, which optical system includes lenses 23 and 24 and an optical filter 25. The filter 25 comprises a stopper having a pair of openings formed at positions spaced from the optical axis of the optical system 101. The image pickup device 11 is communicated with a processing device 103 through a signal line, and the processing device 103 is communicated with the driving means 102 through a signal line.

Details of the optical system 101 will now be explained. Each of the lenses 23 and 24 has a predetermined focal length. In FIG. 5, the filter 25 (the position thereof) and the position A as depicted by arrows at the right-hand side of the lens 23 are set at respective sites each being spaced from the lens 23 (principal plane thereof) by the focal length of the lens 23 along the optical axis of the system. On the other hand, the filter 25 and the image pickup surface of the image pickup device 11 are set at respective sites each being spaced from the lens 24 (principal plane thereof) by the focal length of the lens 24 along the optical axis of the system.

The laser beam emanating from the He-Ne laser 2 and having a wavelength different from that of the exposure light, is inputted to the acoustooptic element (AO element) 26 by which the beam is modulated to control the light quantity of the beam directed to the mirror 21. Here, on/off control wherein light is completely intercepted in a certain state and light is directed to the mirror 21 in another state, is made. In the "on" state, the beam is directed to the mirror 1 so that it is reflected by the mirror 21 whose rotation is controllable in two axes. The light from the mirror 21 is inputted to the f-$\theta$ lens 22. Then, the light is reflected by the polarization beam splitter 5, and through a quarter waveplate 6, a lens 7, a mirror 8 and a projection lens system 1, the wafer alignment mark GW on the wafer W surface is illuminated with a substantially parallel laser beam.

Figure 6:
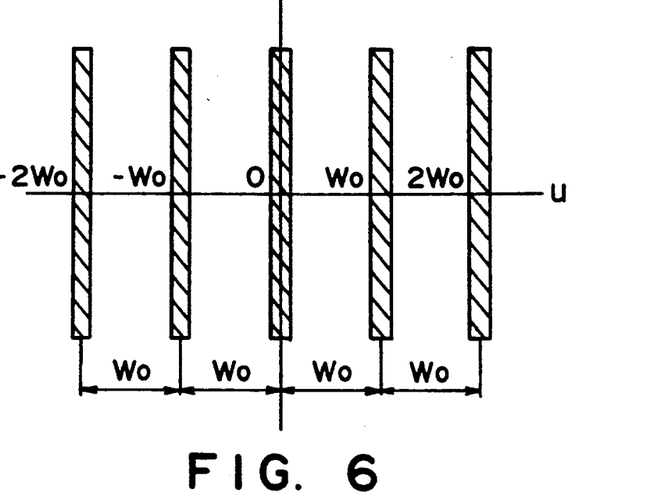
FIG. 6 illustrates a distribution of laser beams on a pupil plane of a projection lens system of FIG. 5.

Here, under the influence of the control of the light quantity through the AO element 26 and synchronized control of the rotation of the mirror 21, the laser beam produces a number of discrete slit-like coherent effective light sources (which are mutually incoherent) such as illustrated in FIG. 6, upon a pupil plane of an optical system comprising the projection lens system 1 and the lenses 22 and 7. These coherent effective light sources have a pitch $W_0$ which can be represented by:

$$W_0 = \lambda / Lw$$

wherein $\lambda$ is the wavelength of the laser beam.

Also in FIG. 6, characters v and u denote the coordinates of the pupil plane, and the coordinate of each effective light source represents the angle of incidence of the laser beam therefrom upon the wafer W surface.

Reflected light from the wafer alignment mark GW on the wafer W surface, illuminated with the laser beam, passes through the projection lens system 1. Thereafter, through the mirror 8, the lens 7, the quarter waveplate 6, the polarization beam splitter 5, the lens 9 and the beam splitter 10, it forms an image of the wafer alignment mark GW at a position A denoted by the arrows.

The light having formed the image of the wafer alignment mark GW passes through the lens 23 and is inputted to the filter 25. By this filter 25, only those components of the light reflected from the wafer alignment mark GW that correspond to the emission angles of $\pm \sin^{-1} W_0$, from the wafer W, with respect to the optical axis of the projection lens system 1 are extracted to be directed to the lens 24, whereas the remaining light is intercepted. Then, through the lens 24, these light beams are superposed one upon another, on the image pickup surface of the image pickup device 11, such that these beams interfere with each other to form an image (interference fringe) of the wafer alignment mark GW on the image pickup surface.

On the other hand, the light from a light emitting diode (LED) 12 which emits light of a wavelength different from that of the beam illuminating the wafer alignment mark GW, is concentrated upon a reference plate 14 by means of a condenser lens 13, to illuminate a reference mark Gs formed on the reference plate 14. Then, the light from the reference mark Gs is directed to the optical system 101 by a lens 15 and a beam splitter 10 which is arranged to reflect the light from the LED 12 and to transmit the light from the He-Ne laser 2. At this time, an image of the reference mark Gs is formed temporarily at the position A.

The image of the reference mark Gs formed at the position A is re-imaged by the optical system 101 on the image pickup surface of the image pickup device 11, like the image of the wafer alignment mark GW. In this embodiment, the optical system 101 constituted by the lenses 23 and 24 is satisfactorily aberration-corrected with respect to both of the wavelengths used for the formation of the image of the reference mark Gs and the formation of the image of the wafer alignment mark GW.

As described hereinbefore, the driving means 102 serves to control "on" and "off" of the laser beam by the AO element 26. More specifically, it controls the AO element 26 so as to interrupt the illumination to the wafer W, in such a direction that is concerned with the formation of a low-contrast image of the wafer alignment mark GW, this being made on the basis of an output signal from the processing means 103 which is operable to detect the contrast of the image of the wafer alignment mark GW.

Figure 8:
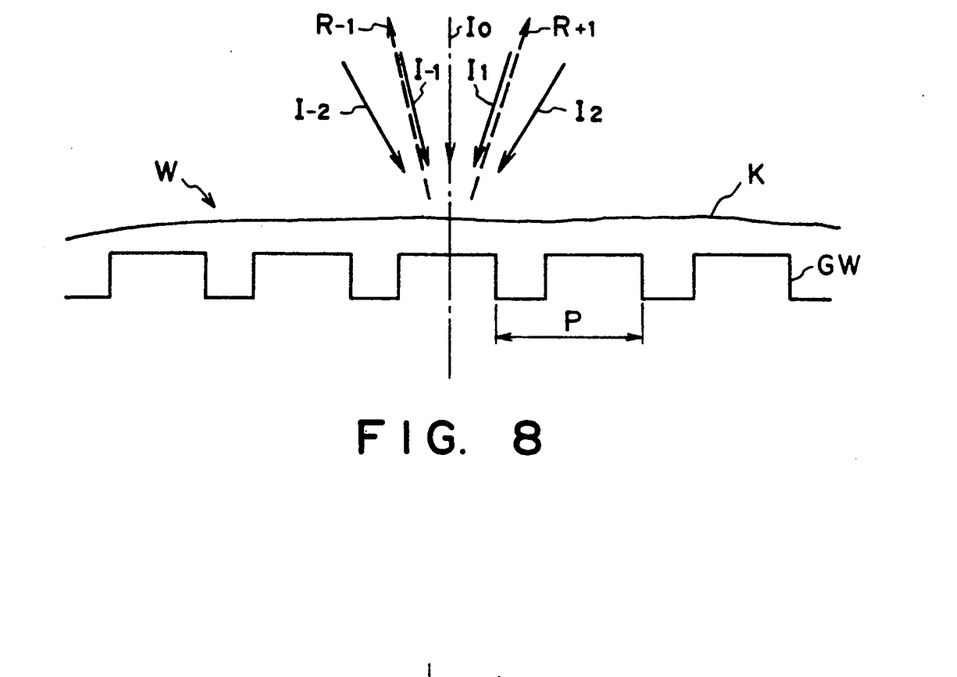

More specifically, while rotating the galvano mirror 21 regularly, the laser beam from the He-Ne laser 2 is modulated by the AO element 26 and, at predetermined timing, it is directed sequentially to the galvano mirror 21. By this, on the pupil plane of the optical system (22, 7, 1), namely, the pupil plane of the projection lens system 1, a plurality of effective light sources such as shown in FIG. 6 are formed. Laser beams from these effective light sources are directed to the wafer in sequence, as a result of which, the wafer W is illuminated with a number of parallel laser beams in different directions. If, in FIG. 6, the effective light source changes in an order from the rightmost to the leftmost light source, then the wafer alignment mark GW covered by a resist K is illuminated with a number of beams such as illustrated in FIG. 8, in an order of $I_2$, $I_1$, $I_0$, $I_{-1}$ and $I_{-2}$. The beam denoted at $I_0$ is the one which perpendicularly illuminates the wafer W in a direction along the optical axis of the projection lens system 1 (the direction substantially perpendicular to the surface of the wafer W). Each of these beams is directed to the mark GW along a plane of incidence that contains a normal to the wafer W surface and the direction of the grating array of the mark GW. Upon the image pickup surface of the image pickup device 11, there are formed, in sequence, a number of images (interference fringes) based on the illumination with the beams $I_2$, $I_1$, $I_0$, $I_{-1}$ and $I_{-2}$. Here, under the influence of the filter 25, each image is formed as a result of the interference between the reflected beams emanating from the wafer W in predetermined directions other than the direction of the optical axis of the projection lens system 1. With the difference in the direction of illumination with the laser beam, there appears a difference in contrast between these images. Such difference in contrast can be detected in the processing device 103 by, for example, comparing the amplitude of each video signal, corresponding to an associated image, with a certain reference having been predetermined with respect to that image, or by comparing the amplitudes of the video signals of the respective images with each other. Then, the processing device 103 detects one or ones of these images having relatively low contrast and discriminates the direction of illumination (namely, the effective light source) that concerns the formation of such image.

In the example of FIG. 8, five images are formed through the illumination with the beams $I_2$, $I_1$, $I_0$, $I_{-1}$ and $I_{-2}$. If, for example, the images formed through the illumination with the beams $I_2$, $I_0$ and $I_{-2}$ are discriminated as being the images having relatively low contrast, then the position of the wafer alignment mark GW is detected on the basis of the images having been formed through the illumination with the beams $I_1$ and $I_{-1}$ or, alternatively, the wafer alignment mark GW is illuminated again with the beams $I_1$ and $I_{-1}$ and the position thereof is detected on the basis of the images formed through such re-illumination with the beams $I_1$ and $I_{-1}$. On the other hand, when a desirable image or images or an undesirable image or images are to be determined by comparing the contrast of each of the five images (in the case of the FIG. 8 example) with a predetermined reference (reference contrast), if the contrast of the first image compared at first with the reference (reference contrast) or the contrast of each of first and second images compared at first and at second with the reference (reference contrast), is not lower than the reference (reference contrast), then the comparison of the remaining four or three images with the reference (reference contrast) may be omitted, such that the position of the wafer alignment mark GW may be detected on the basis of such image or images having high contrast. Alternatively, the wafer alignment mark GW may be illuminated again with a laser beam or beams in the direction or directions that concern the formation of high-contrast desirable image or images, and the position of the wafer alignment mark GW may be detected on the basis of the image or images formed through the re-illumination in that direction or directions.

Figure 7A:
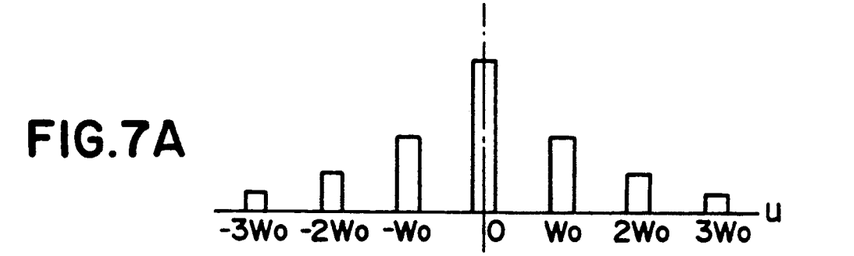
FIGS. 7A through 7C and 8 are schematic views, for explaining the principle of detecting an alignment mark of a wafer by use of the position detecting device of the FIG. 5 embodiment.
Figure 7B:
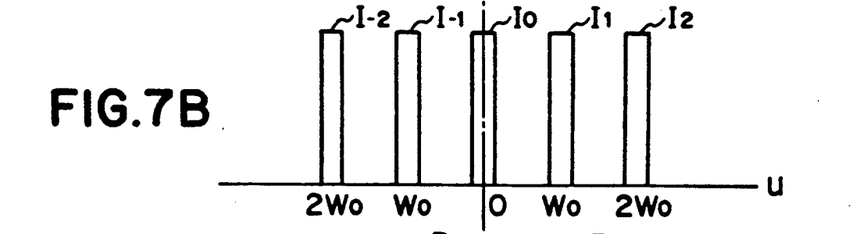
Figure 7C:
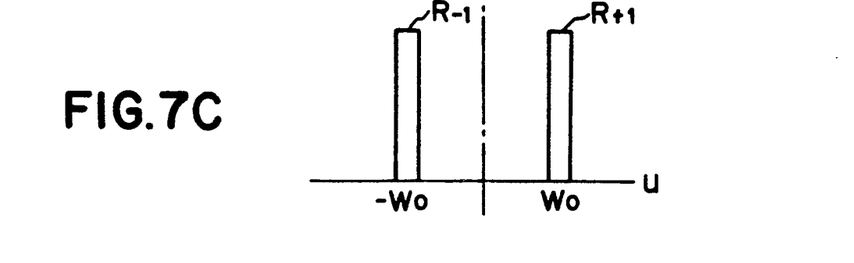

The filter 25 is provided at a position which is optically conjugate with the pupil plane of the projection lens system 1. With this arrangement, an image of the wafer alignment mark GW can be formed on the image pickup surface of the image pickup device 11 only by those of the reflected beams from the wafer alignment mark GW that emanate from the wafer W in particular directions. This is because depending on the distribution of the emission angles of the reflected beams from the wafer alignment mark GW, a distribution of reflected beams is produced on the pupil plane of the projection lens system 1. Particularly, since the wafer alignment mark GW is formed by a grating pattern, the distribution of the reflected beams upon the pupil plane corresponds to the distribution of diffracted beams of different orders, produced by the wafer alignment mark GW. FIG. 7A, shows an example of an intensity distribution of the reflected beams on the pupil plane. The illustrated one is a distribution formed when the wafer W is perpendicularly illuminated with a laser beam (i.e. the illumination with the beam $I_0$ in FIG. 8). In the present embodiment, as described with reference to FIG. 6, the wafer W is illuminated with the beams from a number of effective light sources. The intensity distribution of these effective light sources (laser beams) on the pupil plane of the projection lens system 1 is such as illustrated in FIG. 7B. Therefore, the intensity distribution of the reflected beams from the wafer alignment mark GW on the pupil plane differs with the difference in effective light source used. Namely, it differs with the difference in the direction of laser beam illumination. Since the filter 25 and the pupil plane of the projection lens system 1 are optically conjugate with each other, the intensity distribution on the pupil plane of the projection lens system 1 is reproduced on the light receiving surface of the filter 25. In the present embodiment, the filter 25 has its openings formed so as to direct, to the image pickup device 11, only those reflected beams which emanate from the wafer alignment mark GW in the positive and negative first order directions (wherein the direction of the optical axis of the projection lens system 1 is defined as the zero-th order direction), such that those reflected beams interfere with each other on the image pickup surface of the device 11. FIG. 7C shows the intensity distribution of the reflected beams on the light emitting surface of the filter 25. Here, the positive and negative first order direction are those directions in which a positive first order reflective diffraction beam and a negative first order reflective diffraction beam are produced when the wafer W is perpendicularly illuminated along the optical axis of the projection lens system 1. These directions are determined by the pitch P of the wafer alignment mark GW and the wavelength $\lambda$ of the laser beam.

Referring back to FIG. 2C, the center of the wafer alignment mark GW of the wafer W is on the Y axis and when this wafer alignment mark GW is perpendicularly illuminated with a laser beam from an effective light source $u=0$ in FIG. 6, the complex amplitude distribution of reflected beams produced by this wafer alignment mark GW can be represented by a complex even function $f(x)$. This function satisfies $f(x)=f(-x)$. The complex amplitude distribution of these reflected beams is propagated, as it is, to the pupil plane of the projection lens system 1, and the complex amplitude distribution $f(w)$ of the reflected beam on the pupil plane can be represented as follows:

$$F(w) = G(w)e^{iH(w)}$$

where $G(w)$ and $H(w)$ are real even functions wherein $G(w)>0$, $0<=H(w)<2\pi$ and where $|G(w)|^2$ is the object spectrum corresponding to the intensity distribution of the reflected beams on the pupil plane, as illustrated in FIG. 7A.

Next, if the center of the wafer alignment mark GW of the wafer W is at a position shifted by $\Delta x$ from the Y axis and when this wafer alignment mark GW is illuminated with a laser beam from an effective light source $u=Wi$ in FIG. 6, then the complex amplitude distribution of reflected beams produced by the wafer alignment mark GW on the pupil plane of the projection lens system 1 can be represented by:

$$F(w_i, \Delta x, w) = G(w-w_i)e^{iH(w-w_i)}e^{i\Delta x(w-w_i)k}$$

$$(k = 2\pi/\lambda)$$

Here, when the coordinate $w_i$ of the effective light source is $w_i = nw_0$ ($n=0, \pm 1, \pm 2, \pm 3, \ldots$), the lights that pass through the filter 25 having openings formed at positions corresponding to $u = \pm w_0$ (see FIG. 7, part (C)) are the two which can be represented by:

$$F(nw_0, \Delta x, w_0)$$
$$= G((1-n)w_0)e^{iH((1-n)w_0)}e^{i\Delta x(1-n)w_0 k}$$
$$= G((n-1)w_0)e^{iH((n-1)w_0)}e^{-i\Delta x(n-1)w_0 k}$$

$$F(nw_0, \Delta x, -w_0)$$

$$= G((n+1)w_0)e^{iH((n+1)w_0)}e^{-i\Delta x(n+1)w_0 K}$$

Then, the light intensity distribution $i(nw_0, \Delta x, x')$ formed on the image pickup surface of the image pickup device 11 by these two lights from the filter 25 is produced as a result of the interference of these beams and, therefore, it can be represented by the following equation:

$$I(nw_0, \Delta x, x') =$$
$$|F(nw_0, \Delta x, w_0)e^{-w_0 k x'} + F(nw_0, \Delta x, -w_0)e^{iw_0 k x'}|^2 =$$
$$G[(n+1)w_0]^2 + G[(n-1)w_0]^2 +$$
$$2G[(n+1)w_0]G[(n-1)w_0]\cos[2w_0 k x -$$
$$2\Delta x k w_0 + H(n+1) - H(n-1)]$$

Also, the sum $II(n, -n)$ of the light intensity distributions on the image pickup surface formed by the illumination with the beams from two effective light sources of those having coordinates $u = \pm n w_0$ ($n=0, 1, 2, 3, \ldots$), can be represented by:

$$II(n, -n) = 2\{G[(n+1)w_0]^2 + G[(N-1)w_0]^2\} +$$
$$4G[(n+1)w_0]G[(n-1)w_0]\cos[H(n+1) -$$
$$H(n-1)]\cos[2\pi(2x'/p - 2\Delta x/p)]$$

The sum $II(n, -n)$ is an intensity distribution of a COS function, having constantly a period $P/2$ and having a positional deviation corresponding to the positional deviation of the center of the wafer alignment mark GW of the wafer W from a predetermined position. Namely, with reflected beams from a wafer alignment mark GW formed on a wafer and having a relief shape as illustrated in FIG. 8, it is always possible to form, on the image pickup surface, a light intensity distribution of a desired period, such as that described above, independently of any change in the step structure of the mark or in the thickness of the resist K. It is to be noted here that, in the foregoing description, the imaging magnification for the formation of an image of the wafer alignment mark GW on the image pickup surface is 1:1. Since, however, the above-described effects are obtainable essentially independently of the imaging magnification, in a practical device, the imaging magnification $\beta$ may be set to be $\beta > 1$.

The contrast of $II(n, -n)$ is proportional to the power of the object spectrum of $u = (n+1)w_0, (n-1)w_0$. The power of each order of the object spectrum is changeable with the structure of the surface step of the wafer alignment mark GW, the thickness of the resist and the like. Accordingly, when an image II* of the wafer alignment mark is to be formed and if, $$II^* = \sum_{n=0}^{n\max} II(n, -n)$$

wherein n max is the maximum effective light source position, then, an occasion when the contrast of a certain $II(n, -n)$ is low, the contrast of II* is also low. In order to avoid this, in the present embodiment, as described hereinbefore, such an effective light source or sources (i.e., the direction of illumination or directions of illumination) that concern the formation of a low contrast image or images, may be detected by means of the processing device 103 and, while rejecting such effective light source or sources through the operation of the driving means 102, the wafer W may be illuminated with a laser beam or beams from the remaining one or more effective light sources.

The, or each, image of the wafer alignment mark GW obtained with this illumination may be converted into a video signal by means of the image pickup device 11, and the position of the wafer W may be detected by the processing device 103 on the basis of the, or these, signals.

Figure 10:
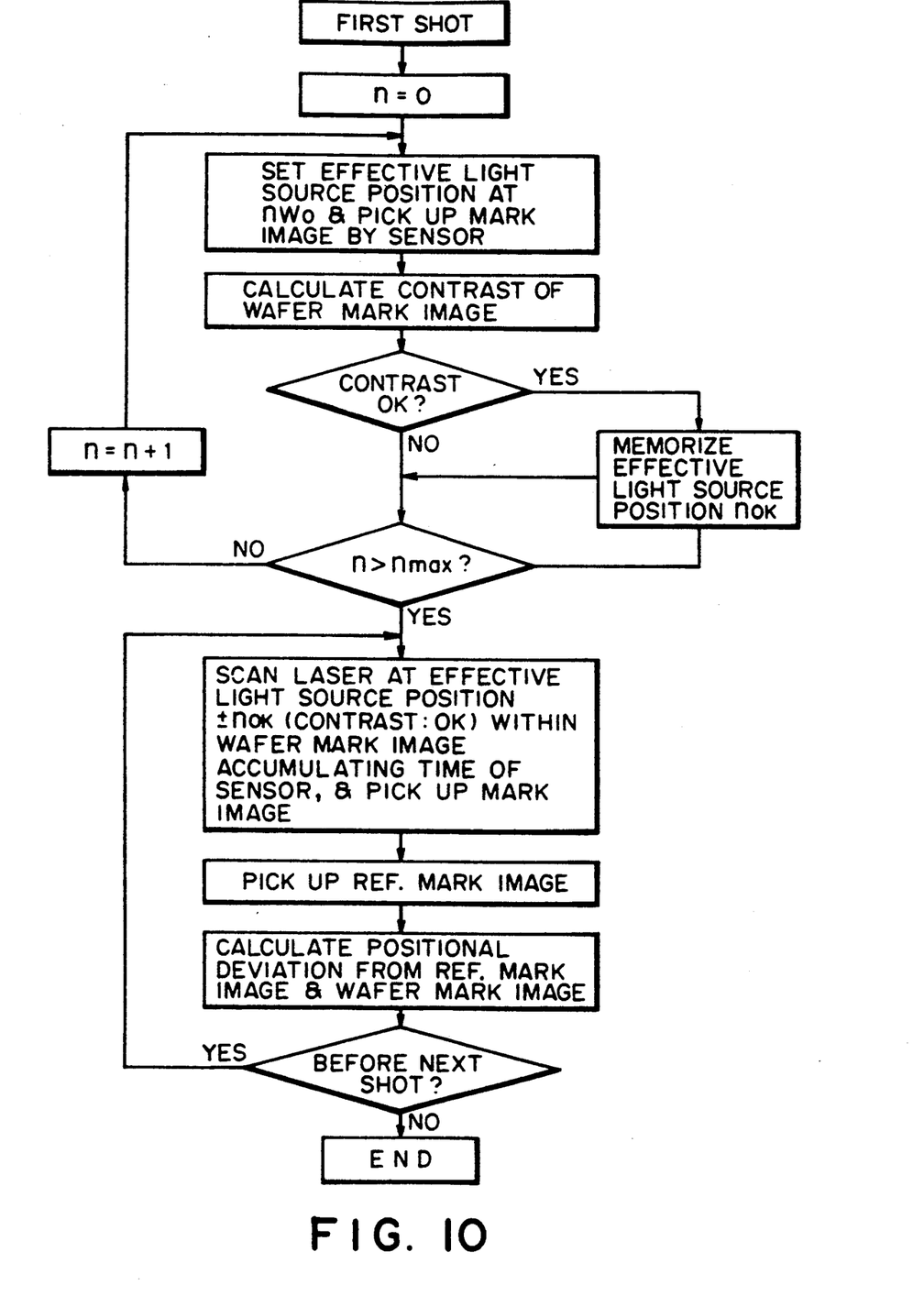
FIG. 10 is a flow chart showing an example of a position detecting operation of the position detecting device of the FIG. 5 embodiment.

FIG. 10 shows a sequence wherein the above-described position detecting operation is to be made to each of different shot areas of the wafer W. In the FIG. 10 example, after those effective light source positions $n_{OK}$ that provide relatively good contrast are detected, the galvano mirror 21 and the AO element 26 are controlled so as to direct the laser beam to these effective light source positions within the image accumulation time of the sensor (image pickup device). Accordingly, the sensor can produce a signal in which the images formed through the illumination with different laser beams from these effective light sources, coming along different directions, are electrically superposed one upon another. Also, in the method shown in FIG. 10, for detection of the effective light source positions $n_{OK}$ of relatively good contrast, the laser beam is directed to the positions on the pupil plane having coordinates $u=0, w_0, 2w_0, \ldots$, and $nw_0$ (see FIG. 7, part (B)). On the other hand, for actual image pickup of the wafer alignment mark, the laser beam is directed to the positions on the pupil plane having coordinates $u = \pm n_{OK}$, for example, $u = -w_0$, $w_0$ u and the like. This is based on an assumption that the images of a wafer alignment mark as formed by the laser beams from a pair of effective light sources which are set at the positions symmetrical with respect to the center of the pupil (i.e. $u=0$), will have substantially the same contrast. As a matter of course, the laser beam may be directed to the positions of all the effective light sources ($u=0, \pm nw_0 (n=1, 2, 3, \ldots)$) which are set for the image pickup of the wafer alignment mark; in each case, the contrast of a wafer alignment mark image may be discriminated; and such an effective light source position that provides a relatively low contrast and such an effective light source position $n_{OK}$ that provides a relatively high contrast may be detected.

Alternatively, the image pickup for the wafer alignment mark may be made for each illumination with a beam from each effective light source position $n_{OK}$ of relatively good contrast, such that video signals corresponding to plural good contrast images may be outputted from the sensor in sequence. On that occasion, the video signals may be accumulated electrically. Alternatively, each video signal is used to detect the position of the wafer, and the obtained results of the wafer position detection may be averaged to determine the wafer position.

Figure 9:
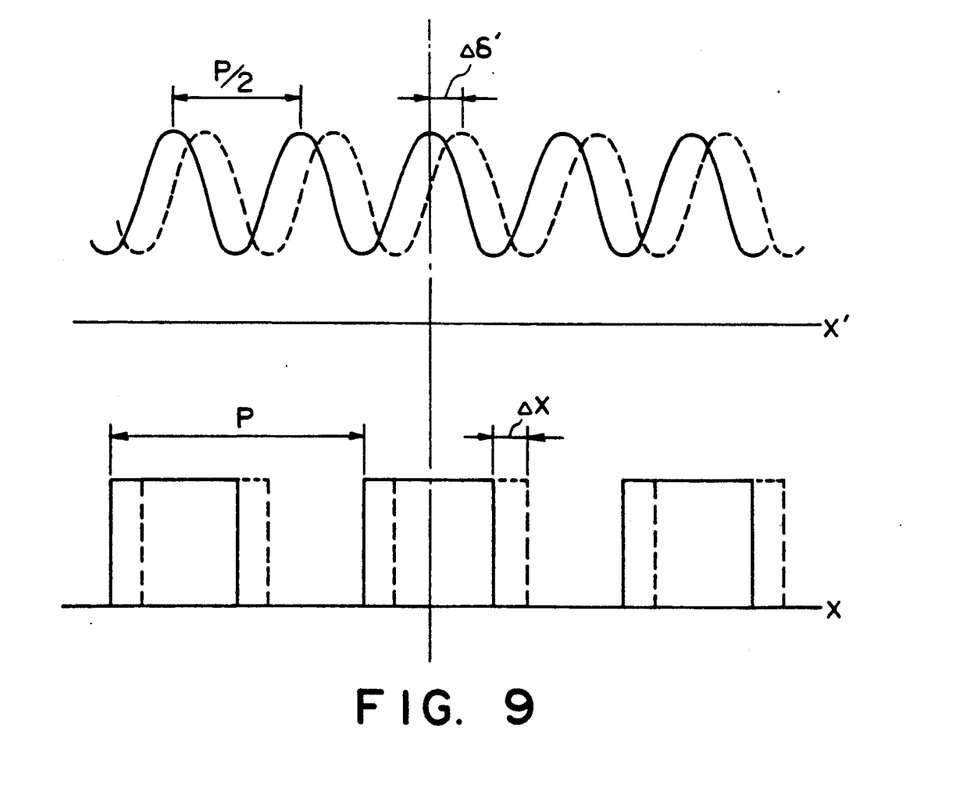
FIG. 9 is a schematic view for explaining the principle of detecting the position of a wafer by use of the position detecting device of the FIG. 5 embodiment.

In the present embodiment, like the example shown in FIG. 1, the pitches Ls and Lw of the reference mark Gs and the wafer alignment mark GW are predetermined in consideration of the respective imaging magnifications, such that the image of the reference mark Gs and the image of the wafer alignment mark GW formed on the image pickup surface of the image pickup device 11 have the same pitch. Thus, from a phase difference $\Delta\delta'$ between the images of the reference mark Gs and the wafer alignment mark GW, as shown in FIG. 9, the relative positional deviation $\Delta x$ between the reference mark Gs and the wafer alignment mark GW can be detected in accordance with the following equation:

$$\Delta x = P(\Delta\delta'/2\pi)$$

In this manner, the relative position of the wafer alignment mark GW on the wafer W surface with respect to the reference mark Gs on the reference plate 14 is detected and, on the basis of the result of the detection, and of the relative positional relationship between the reference mark Gs and the reticle R, having been detected in advance, the reticle R and the wafer W can be aligned with each other.

In the embodiment described hereinbefore, a plurality of images of a wafer alignment mark are formed individually through the illumination with lights in a plurality of different directions. Therefore, if the contrast of an image formed through the illumination in a certain direction is relatively low, it is possible to use an image of relatively good contrast, formed with the illumination in another direction. As a result, the position of the wafer can always be detected correctly. Further, in an aspect of the present invention, the illumination of a wafer W and the formation of a mark image or images can be made, while excluding the illumination in such a direction that concerns the formation of a relatively low contrast image. Therefore, further enhancement in the precision of the wafer position detection is attainable. The selection of the direction of illumination, as described, is applicable not only to a case where, as in the described embodiment, an interference fringe is formed as an image, but also to a case wherein an ordinate image pickup process is used.

In the embodiment described hereinbefore, in place of the mirror 21 controllably rotatable about two axes, a combination of two mirrors each being controllably rotatable about one axis may be used to provide a scanner. Also, an acoustooptic element or an electrooptic element (EO element) or, alternatively, a polygonal mirror, or otherwise, may be used to provide a scanner.

While, in the foregoing embodiment, the relative positional deviation between a wafer alignment mark GW and a reference mark Gs is detected, in place of using the reference mark Gs, a reticle alignment mark may be formed on the reticle and the reticle alignment mark may be imaged on the image pickup surface of the image pickup device. On that occasion, therefore, the positional deviation between the reticle mark and the wafer alignment mark may be detected.

Moreover, in place of the provision of the reference plate 14 and of forming an image of the reference mark Gs upon the image pickup surface of the image pickup device 11, a reference position may be set at a predetermined address of an image memory within the processing device 103 into which the video signal from the image pickup device is memorized, such that the reference position may be used as a reference mark.

As an alternative, those video signals corresponding to the images of the wafer alignment mark Gw, obtained in the detection of the effective light source position (the directions of illumination) providing good contrast, may be memorized in an image memory of the processing device 103, such that the position of the wafer W may be detected by using signals in the memory. On that occasion, it is not necessary to illuminate the wafer W again.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting a position of a substrate by using a grating mark formed on the substrate, said method comprising the steps of:

illuminating the grating mark to produce a plurality of diffraction beams;

extracting a first diffraction beam and a second diffraction beam from the produced diffraction beam by using a spatial filter;

causing the extracted first and second diffraction beams to interfere with each other so as to form an image of the grating mark upon a predetermined plane;

illuminating a grating pattern, provided out of a path of the diffraction beams from the grating mark, to produce diffraction light from the grating pattern;

causing the produced diffraction light to pass through the spatial filter to form an image of the grating pattern on the predetermined plane; and detecting the position of the substrate on the basis of a difference in phase between the image of the grating mark and the image of the grating pattern;

2. A method according to claim 1, wherein the first and second diffraction beams comprise a positive first order diffraction beam and a negative first order diffraction beam, respectively.

3. A method according to claim 1, further comprising sequentially forming the image of the grating mark and the image of the grating pattern.

4. In a semiconductor device manufacturing method wherein a position of a wafer is detected by using a grating mark formed on the wafer and wherein, after positioning the wafer on the basis of the detected position, a circuit pattern is printed on the wafer, the improvement comprising the steps of:

illuminating the grating mark to produce a plurality of diffraction beams;

extracting a first diffraction beam and a second diffraction beam from the produced diffraction beams by using a spatial filter;

causing the extracted first and second diffraction beams to interfere with each other so as to form an image of the grating mark upon a predetermined plane;

illuminating a grating pattern, provided out of a path of the diffraction beams from the grating mark, to produce diffraction light from the grating pattern;

causing the produced diffraction light to pass through the spatial filter to form an image of the grating pattern on the predetermined plane; and detecting the position of the wafer on the basis of a difference in phase between the image of the grating mark and the image of the grating pattern.

5. A method according to claim 4, wherein the first and second diffraction beams comprise a positive first order diffraction beam and a negative first order diffraction beam, respectively.

6. A method according to claim 4, further comprising sequentially forming the image of the grating mark and the image of the grating pattern.

* * * * *

UNITED STATES PATENT AND TRADEMARK OFFICE
CERTIFICATE OF CORRECTION

PATENT NO. : 5,120,974
DATED : June 9, 1992
INVENTOR(S) : Masato Muraki

It is certified that error appears in the above-identified patent and that said Letters Patent is hereby corrected as shown below:

COLUMN 2

Line 4, "image" should read --images--; and
    Line 40, "tion o" should read --tion or--.

COLUMN 4

Line 34, "view" should read --views--.

COLUMN 6

Line 8, "area" should read --areas--.

COLUMN 7

Line 61, "plained" should read --plained.--.

UNITED STATES PATENT AND TRADEMARK OFFICE
CERTIFICATE OF CORRECTION

PATENT NO. : 5,120,974

DATED : June 9, 1992

INVENTOR(S) : Masato Muraki

It is certified that error appears in the above-identified patent and that said Letters Patent is hereby corrected as shown below:

COLUMN 8

Line 12, "mirror 1" should read --mirror 21--.

COLUMN 15

Line 31, "pattern;" should read --pattern.--.

Signed and Sealed this

Third Day of August, 1993

Attest:

MICHAEL K. KIRK

Attesting Officer     Acting Commissioner of Patents and Trademarks